(12) United States Patent
Bedell et al.

(10) Patent No.: US 9,502,420 B1
(45) Date of Patent: Nov. 22, 2016

(54) STRUCTURE AND METHOD FOR HIGHLY STRAINED GERMANIUM CHANNEL FINS FOR HIGH MOBILITY PFINFETS

(71) Applicant: International Business Machines Corporation, Armonk, NY (US)

(72) Inventors: Stephen W. Bedell, Wappingers Falls, NY (US); Lisa F. Edge, Westlake Village, CA (US); Pranita Kerber, Mount Kisco, NY (US); Qiqing C. Ouyang, Yorktown Heights, NY (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/975,721

(22) Filed: Dec. 19, 2015

(51) Int. Cl.
  *H01L 21/8238* (2006.01)
  *H01L 27/092* (2006.01)
  *H01L 29/10* (2006.01)

(52) U.S. Cl.
  CPC ... *H01L 27/0924* (2013.01); *H01L 21/823807* (2013.01); *H01L 21/823814* (2013.01); *H01L 21/823821* (2013.01); *H01L 27/0922* (2013.01); *H01L 29/1054* (2013.01)

(58) Field of Classification Search
  CPC .................. H01L 29/1054; H01L 21/823814; H01L 21/823807; H01L 27/0922; H01L 21/823821; H01L 2924/10271; H01L 21/02381; H01L 21/0245; H01L 21/845; H01L 29/785
  USPC ...................................................... 438/283
  IPC ................................................ H01L 21/823821
  See application file for complete search history.

(56) References Cited

U.S. PATENT DOCUMENTS 6,815,738 B2 11/2004 Rim
7,074,623 B2 7/2006 Lochtefeld et al.
(Continued)

FOREIGN PATENT DOCUMENTS

WO 2013/192119 A1 12/2013

OTHER PUBLICATIONS

Iyer, S. et al., "Optimal Growth Technique and for Strain Relaxation of Si—Ge on Si Substrates," IBM Technical Disclosure Bulletin, vol. 32, No. 8a, Jan. 1990, pp. 330-331.
(Continued)

*Primary Examiner* — Jarrett Stark
*Assistant Examiner* — Bitew Dinke
(74) *Attorney, Agent, or Firm* — Scully, Scott, Murphy & Presser, P.C.; Daniel P. Morris, Esq.

(57) ABSTRACT

A method is provided that includes providing a material stack of, from bottom to top, a relaxed and n-type doped silicon germanium alloy layer and a relaxed silicon germanium alloy layer, each layer having a uniform germanium content, on a surface of a relaxed and graded silicon germanium alloy buffer layer that is located within a pFET device region of a semiconductor substrate. Next, the relaxed silicon germanium alloy layer is patterned to provide at least one relaxed silicon germanium alloy fin having the uniform germanium content on the relaxed and n-type doped silicon germanium alloy layer. A strained germanium layer is then formed surrounding the at least one relaxed silicon germanium alloy fin. A portion of the strained germanium layer and the at least one relaxed silicon germanium alloy fin can be used as composited channel material for fabricating a pFinFET device.

17 Claims, 4 Drawing Sheets

(56) References Cited

U.S. PATENT DOCUMENTS

| | | | |
|---|---|---|---|
| 7,705,345 B2 | 4/2010 | Bedell et al. | |
| 7,759,199 B2 | 7/2010 | Thomas et al. | |
| 8,183,627 B2 | 5/2012 | Currie | |
| 8,324,660 B2 | 12/2012 | Lochtefeld et al. | |
| 2003/0102490 A1* | 6/2003 | Kubo | H01L 21/28185 257/192 |
| 2005/0184316 A1* | 8/2005 | Kim | H01L 29/66795 257/213 |
| 2006/0205167 A1* | 9/2006 | Kavalieros | H01L 21/823807 438/300 |
| 2007/0170471 A1* | 7/2007 | Joly | H01L 27/0688 257/278 |
| 2009/0130826 A1* | 5/2009 | Kim | H01L 21/02381 438/478 |
| 2010/0213477 A1* | 8/2010 | Xu | H01L 33/0041 257/94 |
| 2011/0147711 A1* | 6/2011 | Pillarisetty | B82Y 10/00 257/24 |
| 2012/0032265 A1 | 2/2012 | Simonelli et al. | |
| 2013/0334571 A1 | 12/2013 | Reznicek et al. | |
| 2014/0008700 A1* | 1/2014 | Rachmady | H01L 29/66431 257/192 |
| 2014/0054547 A1* | 2/2014 | Eneman | H01L 29/785 257/24 |
| 2014/0070277 A1 | 3/2014 | Adam et al. | |
| 2014/0151766 A1* | 6/2014 | Eneman | H01L 29/1054 257/288 |
| 2015/0318176 A1* | 11/2015 | Qi | H01L 21/26513 438/283 |
| 2015/0340291 A1* | 11/2015 | Cheng | H01L 21/823821 257/401 |
| 2016/0027780 A1* | 1/2016 | Mitard | H01L 27/0922 257/190 |

OTHER PUBLICATIONS

Liu, C. et al., "Mobility-enhancement technologies." IEEE Circuits and Devices Magazine, vol. 21, No. 3, 2005, pp. 21-36.

* cited by examiner

STRUCTURE AND METHOD FOR HIGHLY STRAINED GERMANIUM CHANNEL FINS FOR HIGH MOBILITY PFINFETS

BACKGROUND

The present application relates to semiconductor technology. More particularly, the present application relates to a semiconductor structure containing a strained germanium layer and a relaxed silicon germanium alloy fin that can be used collectively as a high hole mobility channel material for p-type fin field effect transistors (e.g., p-FinFETs) and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, fin field effect transistors (FinFETs) is the next step in the evolution of complementary metal oxide semiconductor (CMOS) devices. Fin field effect transistors (FinFETs) can achieve higher drive currents with increasingly smaller dimensions as compared to conventional planar FETs. As scaling continues, further improvements over conventional FinFETs are required. For example, there is a need to provide channel materials for FinFET devices that can ensure continued increase in device performance with ever shrinking dimensions.

SUMMARY

In one aspect of the present application, a method of forming a semiconductor structure is provided. In one embodiment of the present application, the method may include providing a material stack of, from bottom to top, a relaxed and n-type doped silicon germanium alloy layer and a relaxed silicon germanium alloy layer, each layer having a uniform germanium content, on a surface of a relaxed and graded silicon germanium alloy buffer layer that is located within a pFET device region of a semiconductor substrate. Next, the relaxed silicon germanium alloy layer is patterned to provide at least one relaxed silicon germanium alloy fin having the uniform germanium content on the relaxed and n-type doped silicon germanium alloy layer. A strained germanium layer is then formed surrounding the at least one relaxed silicon germanium alloy fin.

In another aspect of the present application, a semiconductor structure is provided. In one embodiment of the present application, the semiconductor structure may include at least one relaxed silicon germanium alloy fin having a uniform germanium content on a surface of a relaxed and n-type doped silicon germanium alloy layer having the uniform germanium content, wherein the relaxed and n-type doped silicon germanium alloy layer is present on a surface of a relaxed and graded silicon germanium alloy buffer layer that is located within a pFET device region of a semiconductor substrate. A strained germanium layer is surrounding the at least one relaxed silicon germanium alloy fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
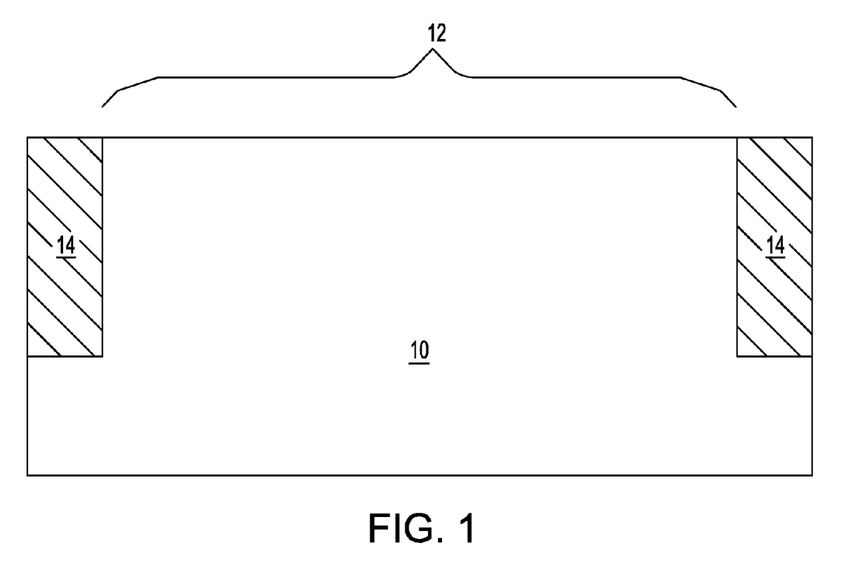
FIG. 1 is a cross sectional view of an exemplary semiconductor structure including a semiconductor substrate containing a pFET device region surrounded by a first trench isolation structure having a first depth in accordance with an embodiment of the present application.

Referring first to FIG. 1, there is illustrated an exemplary semiconductor structure including a semiconductor substrate 10 containing a pFET device region 12 surrounded by a first trench isolation structure 14 having a first depth in accordance with an embodiment of the present application.

In some embodiments of the present application and as shown, the semiconductor substrate 10 can be a bulk semiconductor substrate. The term "bulk semiconductor substrate" denotes a substrate that is entirely composed of at least one semiconductor material having semiconducting properties. When a bulk semiconductor substrate is employed as semiconductor substrate 10, the bulk semiconductor substrate can be composed of, for example, silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. Multilayers of these semiconductor materials can also be used as the semiconductor material of the bulk semiconductor. In one embodiment, the entirety of, or at least a topmost portion of, the semiconductor substrate 10 can be composed of a single crystalline semiconductor material, such as, for example, single crystalline silicon.

The semiconductor substrate 10 may have any of the well known crystallographic orientations including, for example, {100}, {110}, or {111}. Other crystallographic orientations besides those specifically mentioned can also be used in the present application.

In other embodiments, a semiconductor-on-insulator (SOI) substrate (not specifically shown) can be employed as the semiconductor substrate 10. Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer.

The handle substrate and the semiconductor layer of the SOI substrate may comprise the same, or different, semiconductor material. The semiconductor material of the handle substrate and/or semiconductor layer of the SOI substrate may include one of the semiconductor materials mentioned above for the bulk semiconductor substrate. In one embodiment, the handle substrate and the semiconductor layer are both composed of a same semiconductor material such as, for example, silicon. In other embodiments, the semiconductor layer of the SOI substrate is composed of a different semiconductor material than the handle substrate. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

The handle substrate and/or the semiconductor layer of the SOI substrate may be a single crystalline semiconductor material, a polycrystalline material, or an amorphous material. Typically, at least the semiconductor layer is a single crystalline semiconductor material.

The insulator layer of the SOI substrate may be a crystalline or non-crystalline oxide or nitride. In one embodiment, the insulator layer is an oxide such as, for example, silicon dioxide In another embodiment, the insulator layer is a nitride such as, for example, silicon nitride or boron nitride. In yet other embodiments, the insulator layer is a multilayered stack of, in any order, silicon dioxide and boron nitride.

When a SOI substrate is employed as the semiconductor substrate 10 shown in FIG. 1, the SOI substrate may be formed utilizing standard processes including for example, SIMOX (Separation by IMplantation of OXygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 20 nm to 200 nm. Other thicknesses that are lesser than, or greater than, the aforementioned thickness range can also be employed as the thickness for the semiconductor layer. The insulator layer of the SOI substrate may have a thickness from 1 nm to 200 nm. Other thicknesses that are lesser than, or greater than, the aforementioned thickness range can also be employed as the thickness for the insulator layer. The thickness of the handle substrate of the SOI substrate is inconsequential to the present application.

A first trench isolation structure 14 having a first depth is then provided into a portion of the semiconductor substrate 10. When a SOI substrate is employed, the first trench isolation structure 14 at least extends to the topmost surface of the insulator layer.

In some embodiments of the present application, the sidewall surfaces of the first trench isolation structure 14 are substantially vertical. By "substantially vertical" it is meant sidewall surfaces that are ±2.0° from 90°. In some embodiments of the present application, the sidewall surfaces of the first trench isolation structure 14 can have some tapering associated therewith. In such an embodiment, an upper portion of the first trench isolation structure 14 may have a first width, while a lower portion of the first trench isolation structure 14 may have a second width that is less than the first width.

The first trench isolation structure 14 can be formed utilizing a trench isolation process which includes first forming a trench within the semiconductor substrate 10 by lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used.

After providing the trench, the trench is then filled with a trench dielectric material such as, for example, a trench oxide. The filling of the trench may include a deposition process such as, for example, chemical vapor deposition (CVD) or plasma enhanced chemical vapor deposition (PECVD). A planarization process including an etch back process or chemical mechanical polishing (CMP) may follow the trench fill. As is shown, a topmost surface of the trench isolation structure 14 is coplanar with a topmost surface of the semiconductor substrate 10. The first trench isolation structure 14 defines a first area of the semiconductor substrate 10 in which a pFET device can be subsequently formed. The first area of the semiconductor substrate 10 in which a pFET device can be subsequently formed is referred to herein as pFET device region 12.

In some embodiments, a well region (not shown) can be formed into the pFET device region 12 by introducing a dopant into the semiconductor material of the semiconductor substrate 10 that defines the pFET device region 12. The dopant can be introduced utilizing any well known well ion implantation process. It should be noted that an nFET device region (not shown) can lay to the periphery of the pFET device region 12 shown in FIG. 1.

Figure 2:
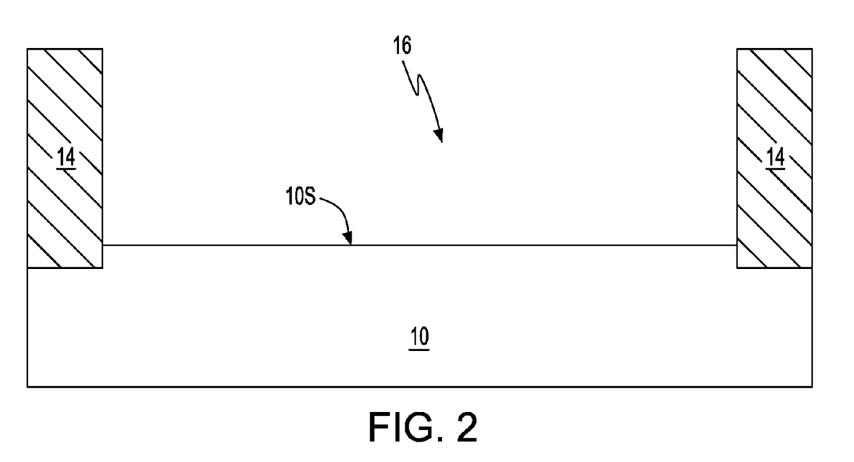
FIG. 2 is a cross sectional view of the exemplary semiconductor structure of FIG. 1 after forming a trench within the pFET device region that exposes a semiconductor material sub-surface of the semiconductor substrate.

Referring now to FIG. 2, there is illustrated the exemplary semiconductor structure of FIG. 1 after forming a trench 16 within the pFET device region 12 that exposes a semiconductor material sub-surface 10S of the semiconductor substrate 10. By "sub-surface" it is meant a portion of the semiconductor substrate 10 that is located between a topmost semiconductor material surface and a bottommost semiconductor material surface. In one embodiment of the present application, the trench 16 has a depth that is less than the first depth of the first trench isolation structure 14. In another embodiment, the trench 16 has a depth that is equal to, or even greater than the first depth of the first trench isolation structure 14. The trench 16 can have a width that extends the entire width of the pFET device region 12 such that sidewall surfaces of the trench isolation structure 14 that bound the pFET device region 12 are exposed. The trench 16 can be formed by lithography and etching as mentioned above in forming the trench for the first trench isolation structure 14.

Figure 3:
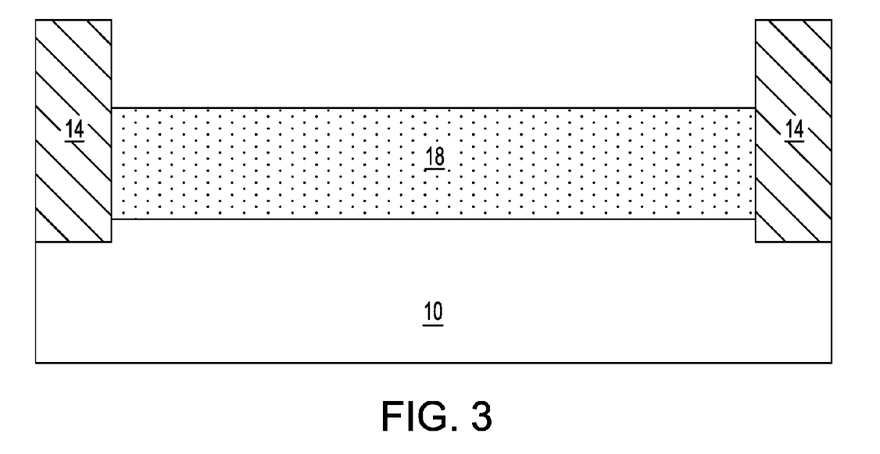
FIG. 3 is a cross sectional view of the exemplary semiconductor structure of FIG. 2 after forming a relaxed and graded silicon germanium alloy buffer layer in the trench.

Referring to FIG. 3, there is illustrated the exemplary semiconductor structure of FIG. 2 after forming a relaxed and graded silicon germanium alloy buffer layer 18 in the trench 16. As is shown, the relaxed and graded silicon germanium alloy buffer layer 18 partially fills the trench 16. The relaxed and graded silicon germanium alloy buffer layer 18 has sidewall surfaces that directly contact a sidewall surface of the first trench isolation structure 14.

The relaxed and graded silicon germanium alloy buffer layer 18 can be formed from the exposed semiconductor material sub-surface 10S of the semiconductor substrate 10 by utilizing an epitaxial growth (or deposition) process. The terms "epitaxial growth and/or deposition" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing the relaxed and graded silicon germanium alloy buffer layer 18, the relaxed and graded silicon germanium alloy buffer layer 18 has the same crystalline characteristic as that of the semiconductor material sub-surface 10S of the semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the relaxed and graded silicon germanium alloy buffer layer 18 can be performed utilizing any well known precursor gas or gas mixture. For example, the relaxed and graded silicon germanium alloy buffer layer 18 can be epitaxially grown utilizing a precursor gas mixture that includes a silicon-containing source (e.g., a silane) and a germanium-containing source (e.g., a germane). In another example, a precursor that contains both a silicon-containing source and a germanium-containing source can be employed. Carrier gases like hydrogen, nitrogen, helium and argon can be used. In some embodiments, an etch back process can follow the epitaxial growth process. In another embodiments, no etch back process is employed.

The relaxed and graded silicon germanium alloy buffer layer 18 has a relaxation value of 90% or greater. The relaxed and graded silicon germanium alloy buffer layer 18 may have a defect density from 1E4 defects/cm$^2$ to 1E5 defects/cm$^2$.

In one embodiment, the relaxed and graded silicon germanium alloy buffer layer 18 has a germanium content that increases gradually from the interface with the semiconductor material sub-surface 10S of the semiconductor substrate 10 to the topmost surface of the relaxed and graded silicon germanium alloy buffer layer 18. In another embodiment, the relaxed and graded silicon germanium alloy buffer layer 18 has a germanium content that increases in a step-wise manner from the interface with the semiconductor material sub-surface 10S of the semiconductor substrate 10 to the topmost surface of the relaxed and graded silicon germanium alloy buffer layer 18.

In either embodiment, the germanium content within an upper portion of the relaxed and graded silicon germanium alloy buffer layer 18 is from 25 atomic percent germanium to 60 atomic percent germanium. In some embodiments of the present application, the relaxed and graded silicon germanium alloy buffer layer 18 has a thickness from 2 micometers to 10 micrometers. Other thicknesses that are lesser than, or greater than, the aforementioned range may also be employed as long as thickness provides a relaxed silicon germanium buffer layer 18.

In some embodiments, the relaxed and graded silicon germanium alloy buffer layer 18 is non-doped. In another embodiment, the relaxed and graded silicon germanium alloy buffer layer 18 contains at least an upper portion that contains an n-type dopant. By "n-type dopant" it is meant the addition of impurities that contributes free electrons to an intrinsic semiconductor material. In a silicon germanium alloy, examples of n-type dopants include, but are not limited to, antimony, arsenic and phosphorus. The n-type dopant can be introduced into the relaxed and graded silicon germanium alloy buffer layer 18 during the epitaxial growth process or after epitaxial growth utilizing one of ion implantation and gas phase doping. The n-type dopant that can be introduced into at least an upper portion of the relaxed and graded silicon germanium alloy buffer layer 18 can have a first dopant content that can range from $1\times10^{18}$ atoms/cm$^3$ to $1\times10^{19}$ atoms/cm$^3$.

Although the present application describes and illustrates the processing steps of first trench isolation structure 14 formation, trench 16 formation and thereafter formation of the relaxed and graded silicon germanium alloy buffer layer 18, the exemplary semiconductor structure shown in FIG. 3 can be formed by first providing trench 16 into the semiconductor substrate 10, then forming the relaxed and graded silicon germanium alloy buffer layer 18, and thereafter forming the first trench isolation structure 14. In such an embodiment, the relaxed and graded silicon germanium alloy buffer layer 18 may be recessed following the forming of the first trench isolation structure 14.

Figure 4:
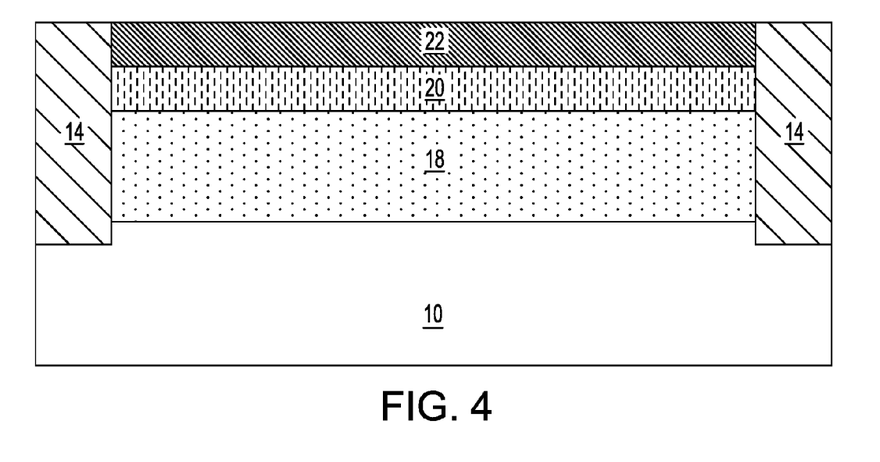
FIG. 4 is a cross sectional view of the exemplary semiconductor structure of FIG. 3 after forming a material stack of, from bottom to top, a relaxed and n-type doped silicon germanium alloy layer and a relaxed silicon germanium alloy layer, each layer having a uniform germanium content, on the relaxed and graded silicon germanium alloy buffer layer.

Referring now to FIG. 4, there is illustrated the exemplary semiconductor structure of FIG. 3 after forming a material stack of, from bottom to top, a relaxed and n-type doped silicon germanium alloy layer 20 and a relaxed silicon germanium alloy layer 22, each layer (20, 22) having a uniform germanium content, on the relaxed and graded silicon germanium alloy buffer layer 18. By "uniform germanium content" it is meant that the content of germanium within the silicon germanium alloy layers (i.e., 20, 22) is the same throughout the entirety of the silicon germanium alloy layer (i.e., 20, 22).

In the present application, the uniform germanium content within the relaxed and n-type doped silicon germanium alloy layer 20 and the relaxed silicon germanium alloy layer 22 is the same as that of the upper portion of the relaxed and graded silicon germanium alloy buffer layer 18. Moreover, the uniform germanium content of the relaxed and n-type doped silicon germanium alloy layer 20 is the same as the uniform germanium content of the relaxed silicon germanium alloy layer 22. In one example, the uniform germanium content within the relaxed and n-type doped silicon germanium alloy layer 20 and the relaxed silicon germanium alloy layer 22 is in a range from 20 atomic percent germanium to 60 atomic percent germanium.

The relaxed and n-type doped silicon germanium alloy layer 20 having the uniform germanium content has a bottommost surface that directly contacts a topmost surface of the relaxed and graded silicon germanium alloy buffer layer 18, while the relaxed silicon germanium alloy layer 22 having the uniform germanium content has a bottommost surface that directly contacts the relaxed and n-type doped silicon germanium alloy layer 20. In some embodiments, the relaxed silicon germanium alloy layer 22 is non-doped. In other embodiments, the relaxed silicon germanium alloy layer 22 is doped with an n-type dopant. The n-type dopant that can be present in the relaxed silicon germanium alloy layer 22 may be the same as, or different, from the n-type dopant that is present in the relaxed and n-type doped silicon germanium alloy layer 20. The concentration of n-type dopant that can be present in the relaxed silicon germanium alloy layer 22 can be the same as, or different from, the dopant concentration of the n-type dopant that is present in the relaxed and n-type doped silicon germanium alloy layer 20. In one embodiment, the n-type dopant concentration of the relaxed and n-type doped silicon germanium alloy layer 20 can be in a range from $1\times10^{18}$ atoms/cm$^3$ to $1\times10^{19}$ atoms/cm$^3$.

The relaxation value of relaxed and n-type doped silicon germanium alloy layer 20 and the relaxed silicon germanium alloy layer 22 are the same and can be from 90% or above. The relaxation value of the relaxed and n-type doped silicon germanium alloy layer 20 and the relaxed silicon germanium alloy layer 22 may be lesser than, the same as, or greater than, the relaxation value of the relaxed and graded silicon germanium alloy buffer layer 18. The relaxed and n-type doped silicon germanium layer 20 and the relaxed silicon germanium layer 22 can have a defect density that is the same as, or lower than the defect density of the relaxed and graded silicon germanium alloy buffer layer.

The relaxed and n-type doped silicon germanium alloy layer 20 can have a thickness from 50 nm to 200 nm, while the relaxed silicon germanium alloy layer 22 can have a thickness from 20 nm to 200 nm. Other thicknesses that are lesser than, or greater than, the aforementioned thicknesses ranges may also be employed as the thickness of the relaxed and n-type doped silicon germanium alloy layer 20 and the relaxed silicon germanium alloy layer 22.

In some embodiments of the present application, the relaxed and n-type doped silicon germanium alloy layer 20 is formed prior to forming the relaxed silicon germanium alloy layer 22. In such an embodiment, the relaxed and n-type doped silicon germanium alloy layer 20 can be formed utilizing a first epitaxial growth process in which n-type dopants are present, and thereafter the relaxed silicon germanium alloy layer 22 is formed utilizing a second epitaxial growth process. In some embodiments, the n-type dopant is not present during the first epitaxial growth process. In such an embodiment, and prior to performing the second epitaxial growth process, the n-type dopants can be added via ion implantation or gas phase doping. The first and second epitaxial growth process include the same basic conditions and apparatuses as used for providing the relaxed and graded silicon germanium alloy buffer layer 18.

In another embodiment, the relaxed silicon germanium alloy layer 22 is formed prior to forming the relaxed and n-type doped silicon germanium alloy layer 20. In such an embodiment, a thick relaxed silicon germanium alloy layer 22 is formed by an epitaxial growth process and thereafter an n-type dopant can be introduced into a lower portion of the a thick relaxed silicon germanium alloy layer 22 to provide the relaxed and doped silicon germanium alloy layer 20.

In some embodiments, and as is shown, the relaxed silicon germanium alloy layer 22 of the material stack has a topmost surface that is coplanar with a topmost surface of the first trench isolation structure 14. Coplanarity may be achieved by performing a planarization process after the epitaxial formation of the relaxed silicon germanium alloy layer 22.

Figure 5:
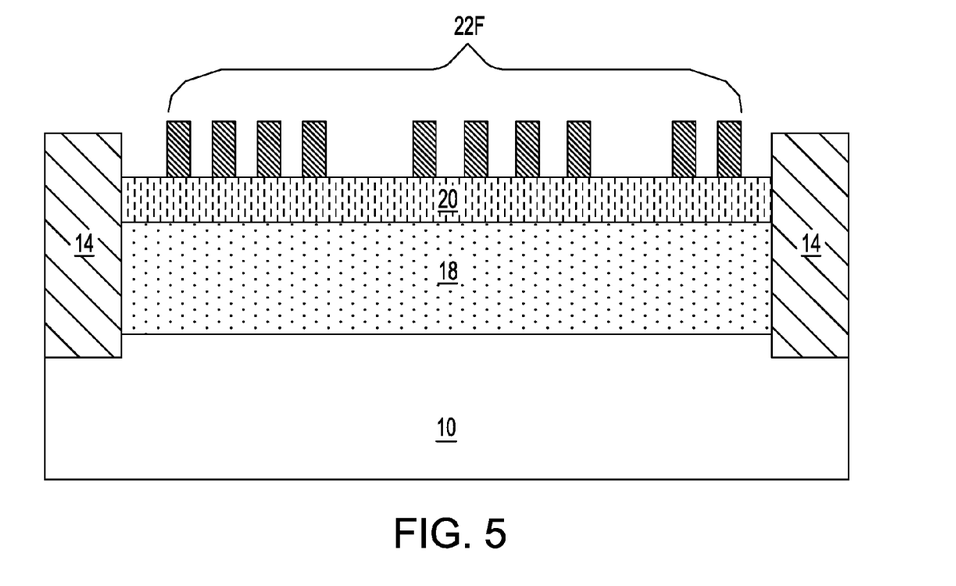
FIG. 5 is a cross sectional view of the exemplary semiconductor structure of FIG. 4 after patterning the relaxed silicon germanium alloy layer having the uniform germanium content to provide a plurality of relaxed silicon germanium alloy fins having the uniform germanium content.

Referring now to FIG. 5, there is illustrated the exemplary semiconductor structure of FIG. 4 after patterning the relaxed silicon germanium alloy layer 22 to provide a plurality of relaxed silicon germanium alloy fins 22F having the uniform germanium content. The plurality of relaxed silicon germanium alloy fins 22F having the uniform germanium content may be doped or undoped as described above. Although a plurality of relaxed silicon germanium alloy fins 22F is shown and described, a single relaxed silicon germanium alloy fin 22F can be formed.

In one embodiment of the present application, the patterning used to provide the plurality of relaxed silicon germanium alloy fins 22F may include lithography and etching, as defined above. In the illustrated embodiment, the etch stops on the relaxed and n-type doped silicon germanium alloy layer 20. Thus, each relaxed silicon germanium alloy fins 22F sits on a surface of the relaxed and n-type doped silicon germanium alloy layer 20.

In another embodiment of the present application, the patterning used to provide the plurality of relaxed silicon germanium alloy fins 22F may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

As used herein, a "relaxed silicon germanium alloy fin" refers to a remaining portion of the relaxed silicon germanium alloy layer 22 and including a pair of vertical sidewalls that are parallel to each other. As used herein, a surface is "vertical" if there exists a vertical plane from which the surface does not deviate by more than three times the root mean square roughness of the surface. In one embodiment of the present application, each relaxed silicon germanium alloy fin 22F has a width from 5 nm to 30 nm. Other widths that are lesser than, or greater than the range mentioned herein can also be used in the present application. The height of each relaxed silicon germanium alloy fin 22F can be from 20 nm to 200 nm; although other heights that are lesser than, or greater than, the aforementioned range may also be employed.

In some embodiments, the width of each relaxed silicon germanium alloy fin 22F can be thicker than a desired thickness. In such an embodiment, the width of each relaxed silicon germanium alloy fin 22F can be thinned prior to forming a strained germanium layer 26. The thinning of each relaxed silicon germanium alloy fin 22F may be performed utilizing any well known fin thinning process such as, for example, oxidation and etching.

In some embodiments, the width of each relaxed silicon germanium alloy fin 22F can be patterned to be thinner than a desired thickness. In such an embodiment, a thick strained germanium layer 26 can be subsequently formed to provide the desired thickness.

Figure 6:
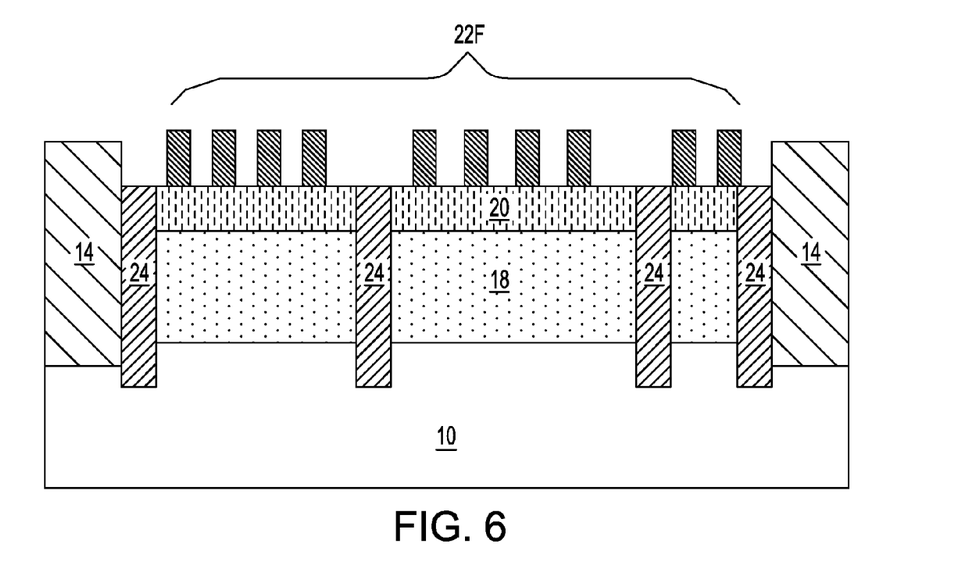
FIG. 6 is a cross sectional view of the exemplary semiconductor structure of FIG. 5 after forming second trench isolation structures having a second depth that is greater than the first depth of the first trench isolation structure.

Referring now to FIG. 6, there is illustrated the exemplary semiconductor structure of FIG. 5 after forming second trench isolation structures 24 having a second depth that is greater than the first depth of the first trench isolation structure 14. The second trench isolation structures 24, which may be referred to herein as local isolation structures, can be formed utilizing the same process and trench dielectric material as mentioned above for providing the first trench isolation structure 14. In some embodiments, and as shown, the bottommost surface of each second trench isolation structure 24 contacts a portion of the semiconductor substrate 10. As is further shown, a topmost surface of each second trench isolation structure 24 is coplanar with a topmost surface of the relaxed and n-type doped silicon germanium alloy layer 20. As is further shown, the topmost surface of each second trench isolation structure is vertically offset and located below a topmost surface of the first trench isolation structure 14.

Figure 7:
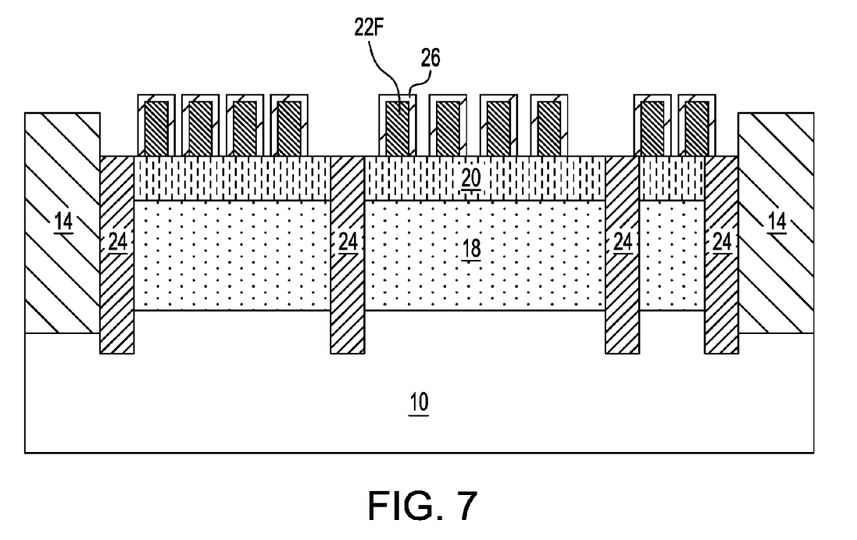
FIG. 7 is a cross sectional view of the exemplary semiconductor structure of FIG. 6 after forming a strained germanium layer surrounding each relaxed silicon germanium alloy fin.

Referring now to FIG. 7, there is illustrated the exemplary semiconductor structure of FIG. 6 after forming a strained germanium layer 26 surrounding each relaxed silicon germanium alloy fin 22F; that is the strained germanium layer 26 is located on each sidewall surface and a topmost surface of a relaxed silicon germanium alloy fin 22F. Collectively, a portion of the strained germanium layer 26 and a portion of the relaxed silicon germanium alloy fin 22F form a composite channel material of the present application. The strained germanium layer 26 is substantially defect free. By "substantially defect free' it is meant that the strained germanium layer 26 has a defect density that is less than 100 defects/$cm^2$.

The strained germanium layer 26 can be formed utilizing a deposition process such as, for example, chemical vapor deposition or plasma enhanced chemical vapor deposition. In some embodiments, the strained germanium layer 26 may be formed utilizing an epitaxial growth process as mentioned above. Lithography and etching may follow the deposition of a continuous layer of strained germanium.

The strained germanium layer 26 is a conformal layer thus the thickness of the strained germanium layer 26 along the sidewalls of each relaxed silicon germanium alloy fin 22F is the same as the thickness of the strained germanium layer 26 that is present on a topmost surface of each relaxed silicon germanium alloy fin 22F. In one embodiment of the present application, the strained germanium layer 26 may have a thickness from 1 nm to 5 nm.

In one embodiment, the strained germanium layer 26 is composed of pure (i.e., unalloyed) germanium. In other embodiments, the strained germanium layer 26 may contain silicon in a content that is less than the silicon content in each silicon germanium alloy fin 22F. Thus, the strained germanium layer 26 has a higher germanium content than each relaxed silicon germanium alloy fin 22F. In some embodiments, the strained germanium layer 26 has a same crystallographic orientation as the relaxed silicon germanium alloy fin 22F. In one example, the strained germanium layer 26 and the relaxed silicon germanium alloy fin 22F have a {110} crystallographic orientation.

The composite channel material of the present application which contains the strained germanium layer 26 can be used a high hole mobility channel material. Moreover, the effective mass of the composite channel material of the present application is low due to the presence of the strained germanium layer 26. Further, a low threshold voltage pFinFET device can be achieved due to the presence of the strained germanium layer 26. Furthermore, the composite channel material of the present application can provide improved carrier confinement.

Figure 8:
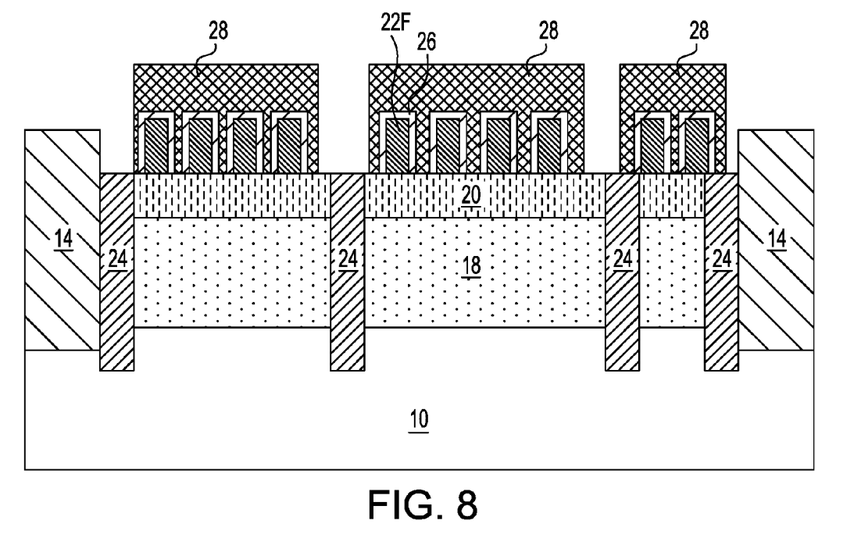
FIG. 8 is a cross sectional view of the exemplary semiconductor structure of FIG. 7 after forming a functional gate structure straddling a portion of each strained germanium layer surrounding each relaxed silicon germanium alloy fin.

Referring now to FIG. 8, there is illustrated the exemplary semiconductor structure of FIG. 7 after forming a functional gate structure 28 straddling a portion of each strained germanium layer 26 that surrounds each relaxed silicon germanium alloy fin 22F. By "functional gate structure" it is meant a permanent gate structure used to control output current (i.e., flow of carriers in the channel) of a semiconducting device through electrical or magnetic fields.

The functional gate structure 28 includes a gate dielectric portion (not separately shown) and a gate conductor portion (also not separately shown). Although a single functional gate structure is shown straddling a portion of each strained germanium layer 26 that surrounds each relaxed silicon germanium alloy fin 22F, a plurality of functional gate structures can be formed each straddling different portions of each strained germanium layer 26 that surrounds each relaxed silicon germanium alloy fin 22F.

Each gate dielectric portion may include a gate dielectric material. The gate dielectric material that provides each gate dielectric portion can be an oxide, nitride, and/or oxynitride. In one example, the gate dielectric material that provides each gate dielectric portion (36L, 36R) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion. Each gate dielectric portion may comprise the same gate dielectric material. In other embodiments, a first set of functional gate structures includes a first gate dielectric portion that comprises a different gate dielectric material than a second set of functional gate structures.

The gate dielectric material used in providing each gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions, block mask technology can be used. In one embodiment of the present application, the gate dielectric material used in providing each gate dielectric portion can have a thickness in a range from 1 nm to 10 nm. Other thicknesses that are lesser than, or greater than, the aforementioned thickness range can also be employed for the gate dielectric material that may provide each gate dielectric portion.

Each gate conductor portion can include a gate conductor material. The gate conductor material used in providing each gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Each gate conductor portion may comprise the same gate conductor material. In one example, each gate conductor portion may comprise a pFET gate metal. In other embodiments, a first set of functional gate structures includes a first gate conductor portion that comprises a different gate conductor material than a second set of functional gate structures.

The gate conductor material used in providing each gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for each gate conductor portion, block mask technology can be used. In one embodiment, the gate conductor material used in providing each gate conductor portion has a thickness from 50 nm to 200 nm. Other thicknesses that are lesser than, or greater than, the aforementioned thickness range can also be employed for the gate conductor material used in providing each gate conductor portion.

Each functional gate structure can be formed by providing a functional gate material stack of the gate dielectric material, and the gate conductor material. The functional gate material stack can then be patterned by lithography and etching. After forming the functional gate structure 28, gate spacers (not shown) and source/drain structures can be formed utilizing techniques well known to those skilled in the art.

In other embodiments of the present application, and prior to forming the functional gate structure, a sacrificial gate structure is formed instead. In yet other embodiments, at least one gate structure is a functional gate structure, and one other gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, and a sacrificial gate material portion. In some embodiments, each sacrificial gate dielectric portion may be omitted. Each sacrificial gate dielectric portion includes one of the dielectric materials mentioned above for gate dielectric portion. Each sacrificial gate material portion includes one of the gate conductor materials mentioned above for the gate conductor portion. The sacrificial gate structure can be formed by deposition of the various material layers and then patterning the resultant sacrificial dielectric material sack by utilizing, for example, lithography and etching. Next, gate spacers can be formed utilizing processes well known to those skilled in the art, and after formation of the source/drain structures, the sacrificial gate structure may be replaced with a functional gate structure as described above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a material stack of, from bottom to top, a relaxed and n-type doped silicon germanium alloy layer and a relaxed silicon germanium alloy layer, each layer having a uniform germanium content, on a surface of a relaxed and graded silicon germanium alloy buffer layer that is located within a pFET device region of a semiconductor substrate;
   patterning said relaxed silicon germanium alloy layer to provide at least one relaxed silicon germanium alloy fin having said uniform germanium content on said relaxed and n-type doped silicon germanium alloy layer; and
   forming a strained germanium layer on exposed sidewall surfaces and a topmost surface of said at least one relaxed silicon germanium alloy fin, and on a portion of, but not an entirety of, a topmost surface of said relaxed and n-type doped silicon germanium alloy layer.

2. The method of claim 1, wherein prior to forming said material stack a trench is provided in said semiconductor substrate, and said relaxed and graded silicon germanium alloy buffer layer is epitaxially grown from a semiconductor material sub-surface of said semiconductor substrate within said trench.

3. The method of claim 1, wherein said providing said material stack comprises:
   first providing said relaxed and n-type doped silicon germanium alloy layer having said uniform germanium content; and
   second providing said relaxed silicon germanium alloy layer having said uniform germanium content.

4. The method of claim 1, wherein said providing said material stack comprises:
   providing said relaxed silicon germanium alloy layer having said uniform germanium content; and
   introducing an n-type dopant within a lower portion of said relaxed silicon germanium alloy layer to provide said relaxed and n-type doped silicon germanium alloy layer.

5. The method of claim 1, wherein said patterning comprises a sidewall image transfer process.

6. The method of claim 2, wherein a first trench isolation structure is formed prior to forming said trench in said semiconductor substrate.

7. The method of claim 6, further comprising forming a second trench isolation structure within said pFET device region prior to forming said strained germanium layer.

8. The method of claim 1, wherein said at least one relaxed silicon germanium alloy fin is thinned prior to forming said strained germanium layer.

9. The method of claim 1, wherein said strained germanium layer has a {110} crystallographic orientation.

10. The method of claim 1, further comprising forming a functional gate structure straddling a portion of said strained germanium layer.

11. The method of claim 1, wherein said strained germanium layer has a conformal thickness.

12. The method of claim 1, wherein said forming said strained germanium layer is carried out after said patterning.

13. The method of claim 12, wherein said forming said strained germanium layer comprises:
   depositing a continuous layer of a strained germanium material; and
   patterning said continuous layer of strained germanium material by lithography and etching.

14. The method of claim 12, wherein said forming said strained germanium layer comprises an epitaxial growth process.

15. The method of claim 1, wherein said strained germanium layer is composed of pure germanium.

16. The method of claim 1, wherein said strained germanium layer contains silicon in a content that is less than a silicon content in said at least one silicon germanium alloy fin.

17. The method of claim 1, wherein said strained germanium layer has a defect density that is less than 100 defects/cm$^2$.

* * * * *